(12) United States Patent
Knollenberg et al.

(10) Patent No.: US 7,741,685 B1
(45) Date of Patent: Jun. 22, 2010

(54) METHOD AND APPARATUS FOR AN ACTUATOR SYSTEM HAVING BURIED INTERCONNECT LINES

(75) Inventors: Clifford F. Knollenberg, El Cerrito, CA (US); Michael Albert Helmbrecht, Lafayette, CA (US)

(73) Assignee: Iris AO, Inc., Berkeley, CA (US)

( * ) Notice: Subject to any disclaimer, the term of this patent is extended or adjusted under 35 U.S.C. 154(b) by 773 days.

(21) Appl. No.: 11/097,599

(22) Filed: Apr. 1, 2005

Related U.S. Application Data

(63) Continuation of application No. 10/705,213, filed on Nov. 7, 2003, now abandoned.

(60) Provisional application No. 60/425,049, filed on Nov. 8, 2002, provisional application No. 60/425,051, filed on Nov. 8, 2002.

(51) Int. Cl.
  *H01L 29/78* (2006.01)
(52) U.S. Cl. ...................... 257/414; 257/415
(58) Field of Classification Search ................ 257/414, 257/415
See application file for complete search history.

(56) References Cited

U.S. PATENT DOCUMENTS

| | | | |
|---|---|---|---|
| 5,096,279 | A | 3/1992 | Hornbeck et al. |
| 6,091,050 | A | 7/2000 | Carr |
| 6,128,122 | A | 10/2000 | Drake et al. |
| 6,283,601 | B1 | 9/2001 | Hagelin et al. |
| 6,315,423 | B1 | 11/2001 | Yu et al. |
| 6,351,330 | B2 | 2/2002 | Ko et al. |
| 6,366,414 | B1 | 4/2002 | Aksyuk et al. |
| 6,440,766 | B1 | 8/2002 | Clark |
| 6,448,622 | B1 * | 9/2002 | Franke et al. .............. 257/415 |

(Continued)

FOREIGN PATENT DOCUMENTS

JP   2001249285 A   9/2001

(Continued)

OTHER PUBLICATIONS

W.C. Tang et al, Laterally Driven Polysilicon Resonant Microstructures, Sensors and Actuators, vol. 2, pp. 1290-1293, 2001.

(Continued)

*Primary Examiner*—Phat X Cao
(74) *Attorney, Agent, or Firm*—Stattler-Suh PC

(57) ABSTRACT

A micromachined actuator including a body or platform mounted to a suspension system anchored to a substrate. In one embodiment, the suspension system is comprised of a set of one or more spring flexures connecting the actuator body to the substrate with strain relief provided via connecting torsional elements. In another embodiment, the suspension system includes a first set of one or more spring flexures each with one end anchored to a largely rigid intermediate frame and the other end attached to the body. A second set of one or more flexures is attached between the intermediate frame and the substrate. A third actuator embodiment maximizes force electrode area to minimize voltage required for electrostatic actuation. A fourth embodiment provides electrical interconnect to an actuator or an actuator array using polysilicon with silicon nitride isolation. Actuators may be fabricated by combining the key features of all four embodiments or actuators may be fabricated using any combination of two or three of the embodiments.

4 Claims, 13 Drawing Sheets

U.S. PATENT DOCUMENTS

| | | |
|---|---|---|
| 6,454,421 B2 | 9/2002 | Yu et al. |
| 6,466,356 B1 | 10/2002 | Peeters et al. |
| 6,525,864 B1 | 2/2003 | Gee et al. |
| 6,543,286 B2 | 4/2003 | Garverick et al. |
| 6,545,385 B2 * | 4/2003 | Miller et al. ............... 310/309 |
| 6,625,004 B1 | 9/2003 | Musolf et al. |
| 6,632,374 B1 * | 10/2003 | Rosa et al. .................. 216/24 |
| 6,759,787 B2 | 7/2004 | Miller et al. |
| 6,781,208 B2 * | 8/2004 | Okumura .................. 257/415 |
| 7,138,745 B1 | 11/2006 | Helmbrecht |
| 2001/0050618 A1 | 12/2001 | Dummermuth |
| 2002/0050167 A1 | 5/2002 | Foote et al. |
| 2002/0122238 A1 | 9/2002 | Kuipe |
| 2004/0160118 A1 | 8/2004 | Knollenberg et al. |
| 2004/0180465 A1 | 9/2004 | Musolf et al. |
| 2004/0240032 A1 | 12/2004 | Miles |
| 2006/0038103 A1 | 2/2006 | Helmbrecht |

FOREIGN PATENT DOCUMENTS

| | | |
|---|---|---|
| WO | WO 00/55666 A1 | 9/2000 |
| WO | WO 02/086586 | 10/2002 |

OTHER PUBLICATIONS

P.Temple-Boyer et al, Residual Stress in Low Pressure Chemical Vapor Deposition $SiN_x$ Films Deposited from Silane and Ammonia, Journal of Vacuum Science and Technology A. 16(4), (1998) pp. 2003-2007.

Helmbrecht, "Micromirrors for Adaptive-Optics Arrays", Transducers '01 Eurosensors XV, the 11th International Conference on Solid-State Sensors and Actuators, Munich, Germany, Jun. 10-14, 2001.

* cited by examiner

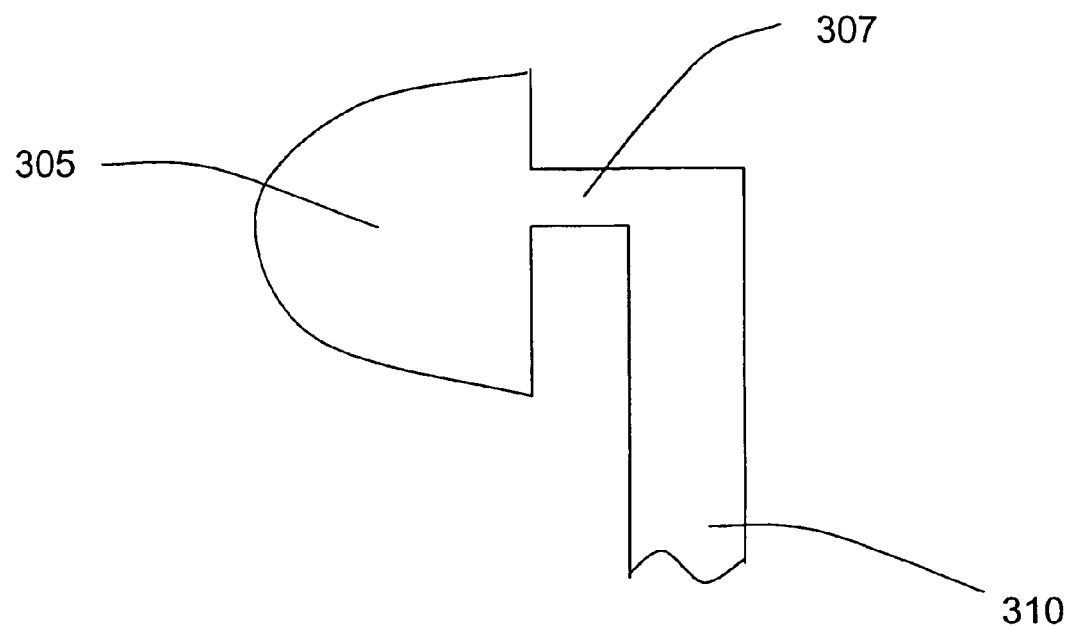
FIGURE: 4
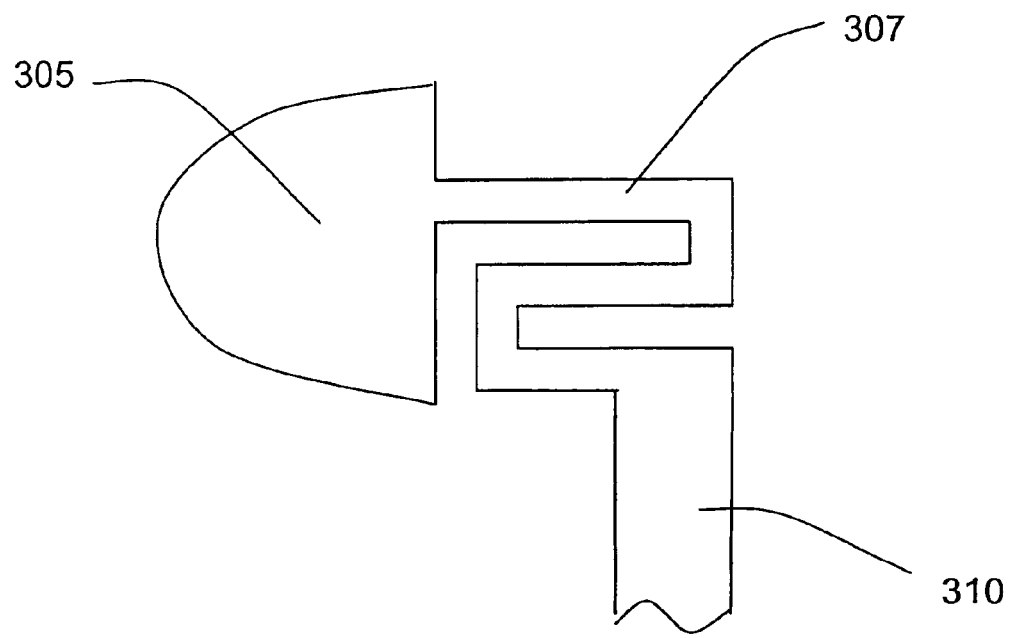
FIGURE: 5

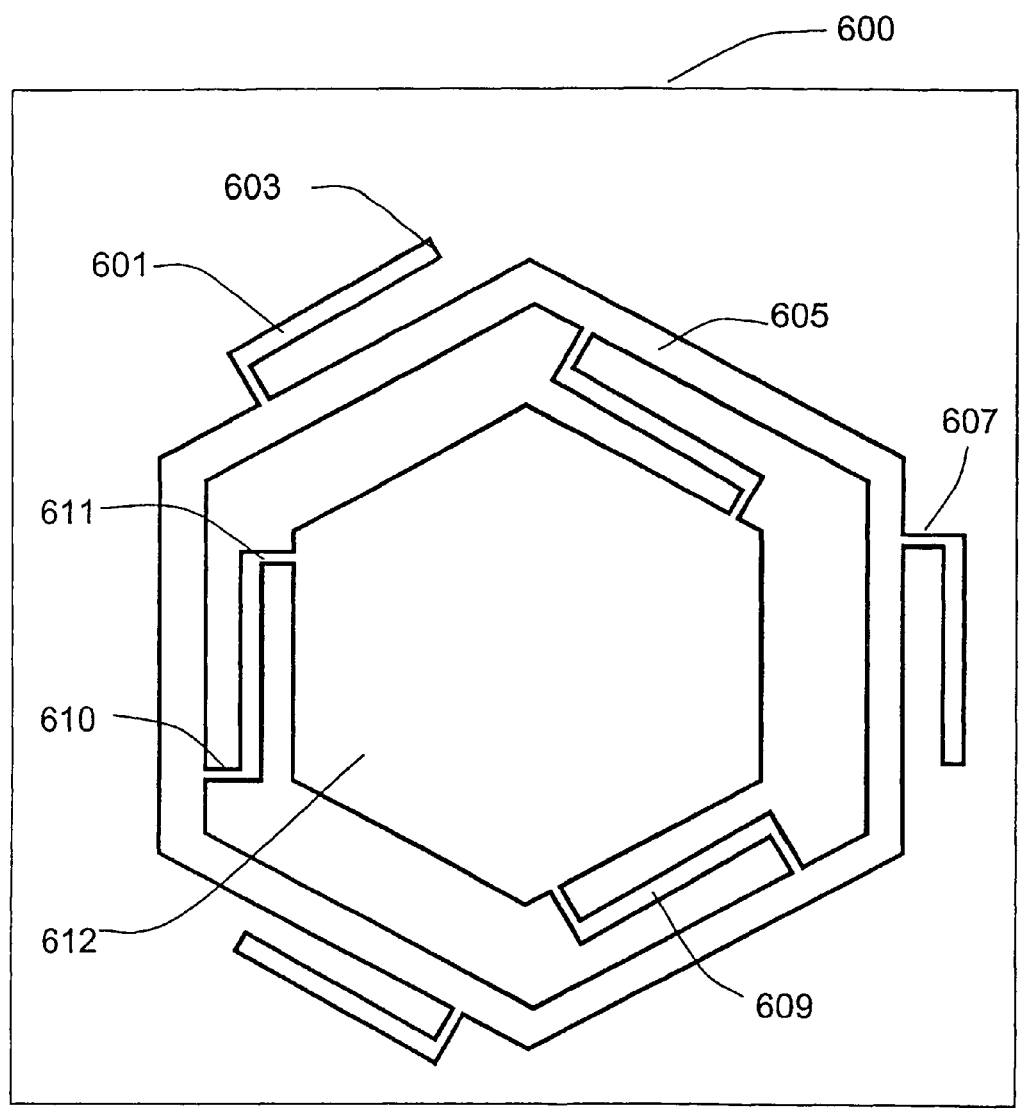
FIGURE: 6

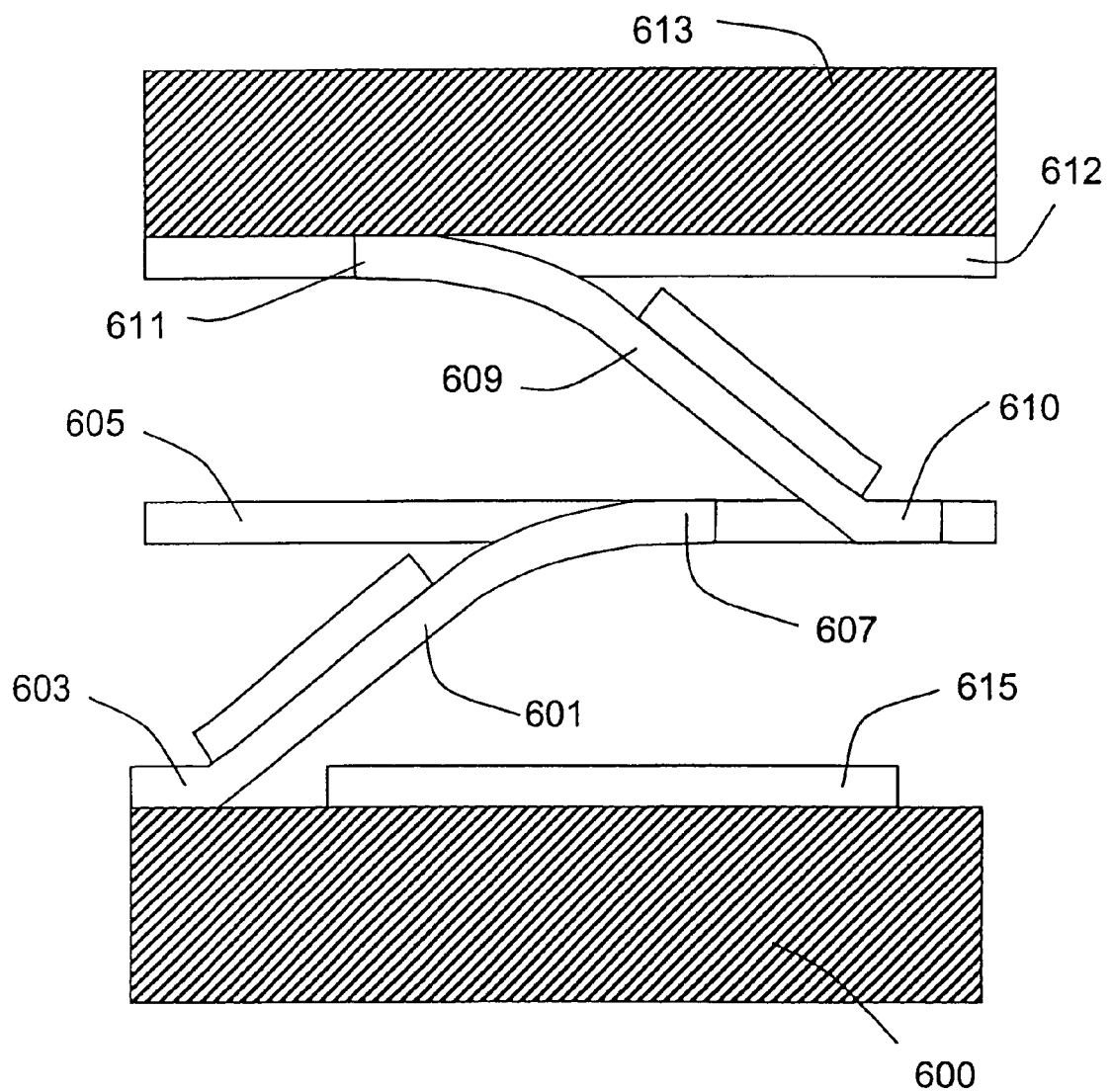
FIGURE: 7

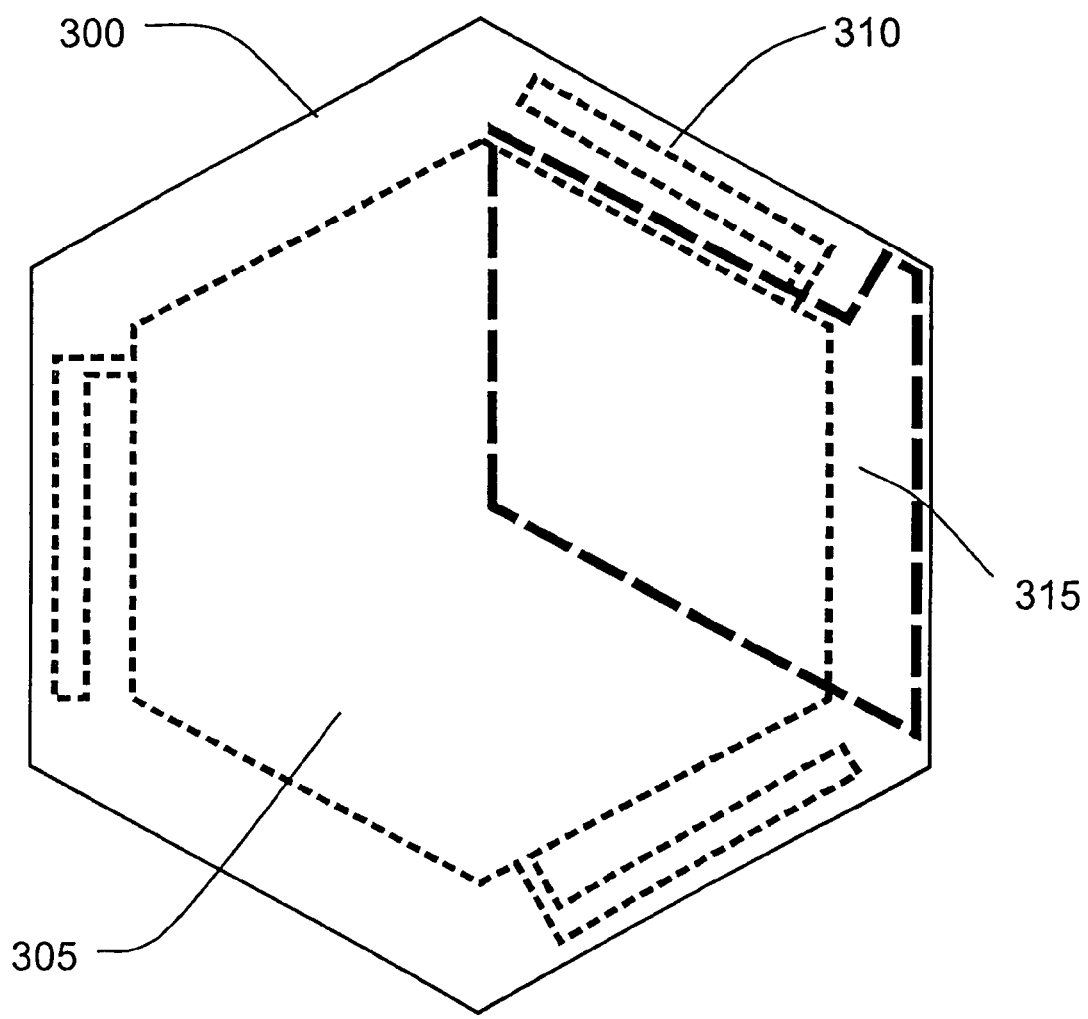
FIGURE: 8

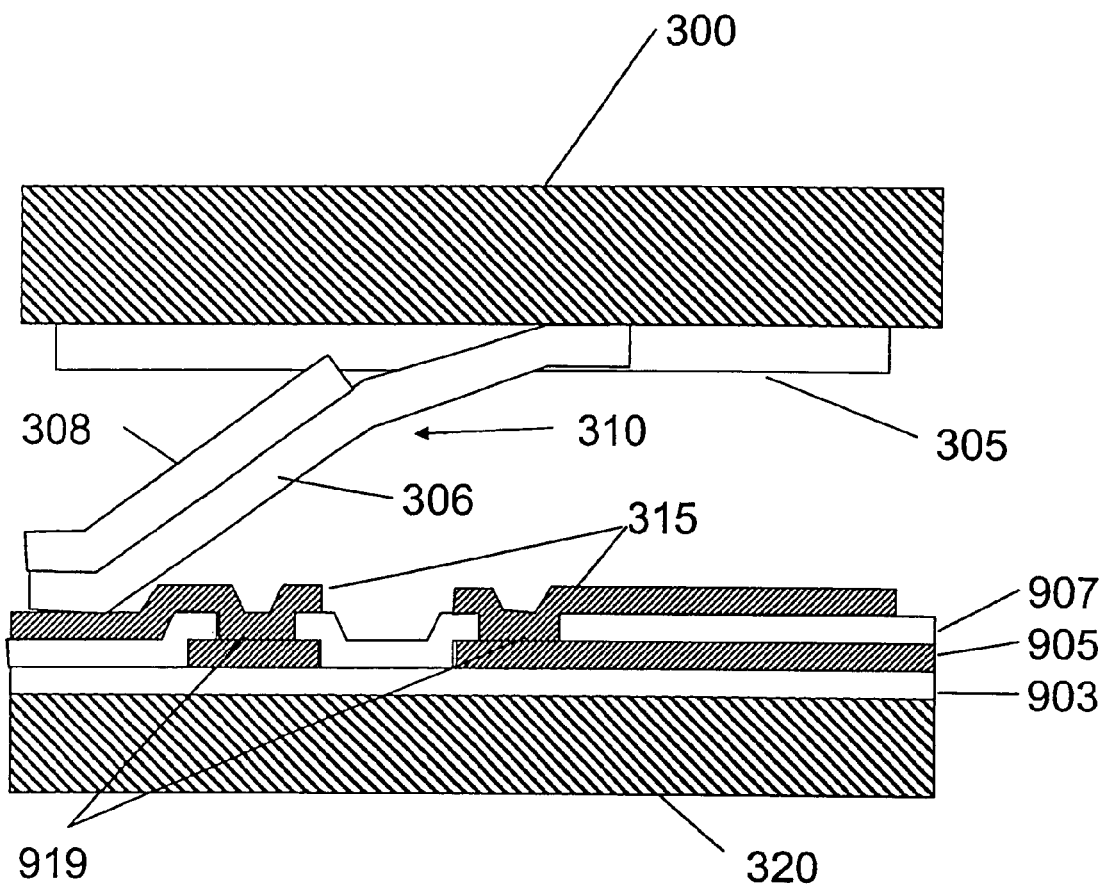
FIGURE: 9

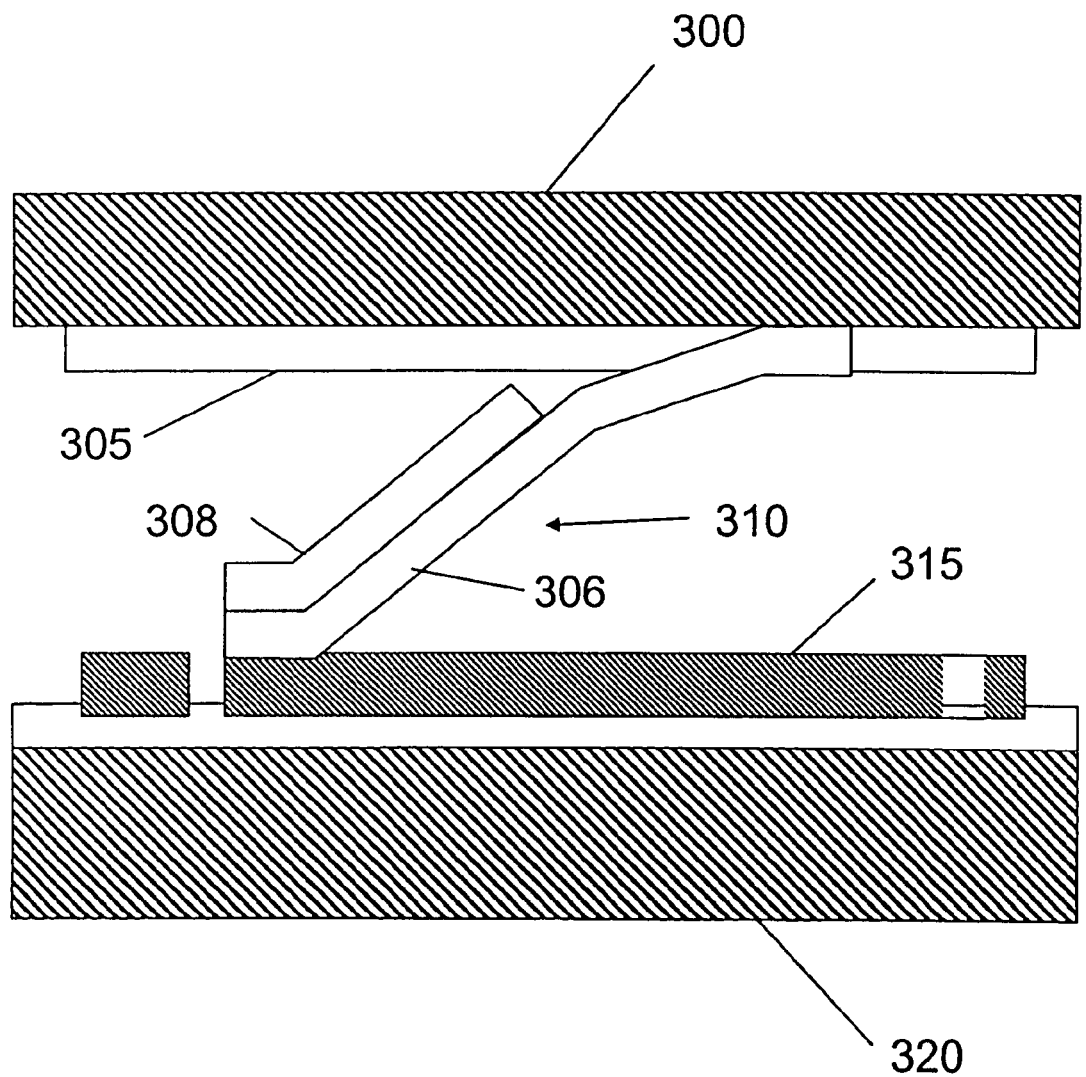
FIGURE: 10

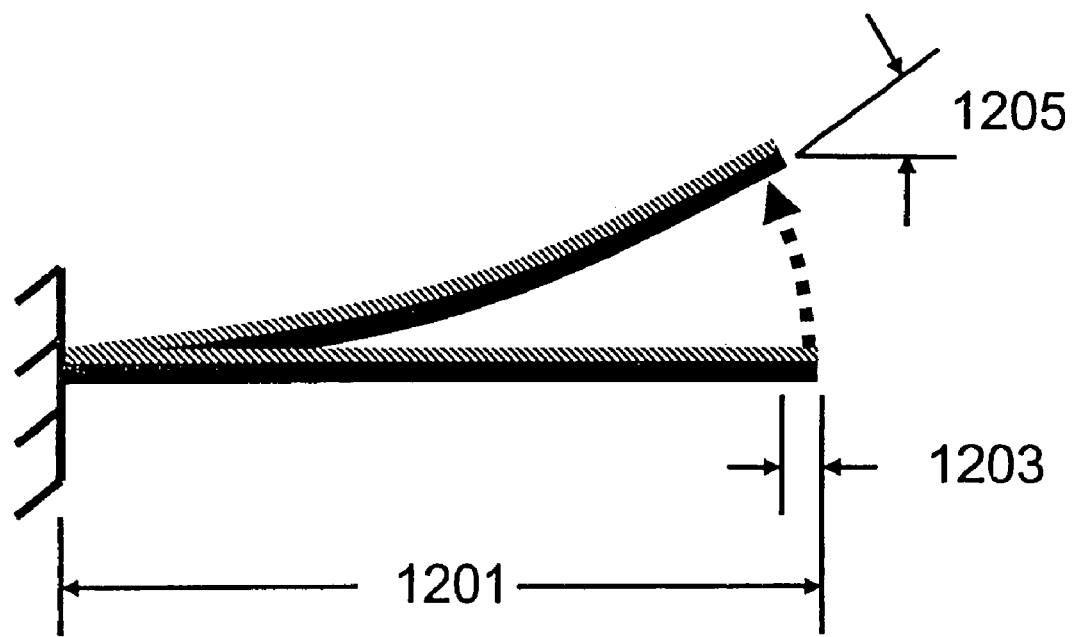
FIGURE: 12

| angle of twist per unit moment (θ/Nm) | t (µm) | h (µm) | i (µm) |
|---|---|---|---|
| 3.50E+07 | 1.1 | 10 | 10 |
| 1.40E+07 | 1.1 | 10 | 4 |
| 6.10E+07 | 1.1 | 6 | 10 |
| 7.00E+06 | 1.1 | 10 | 2 |

FIGURE 13a

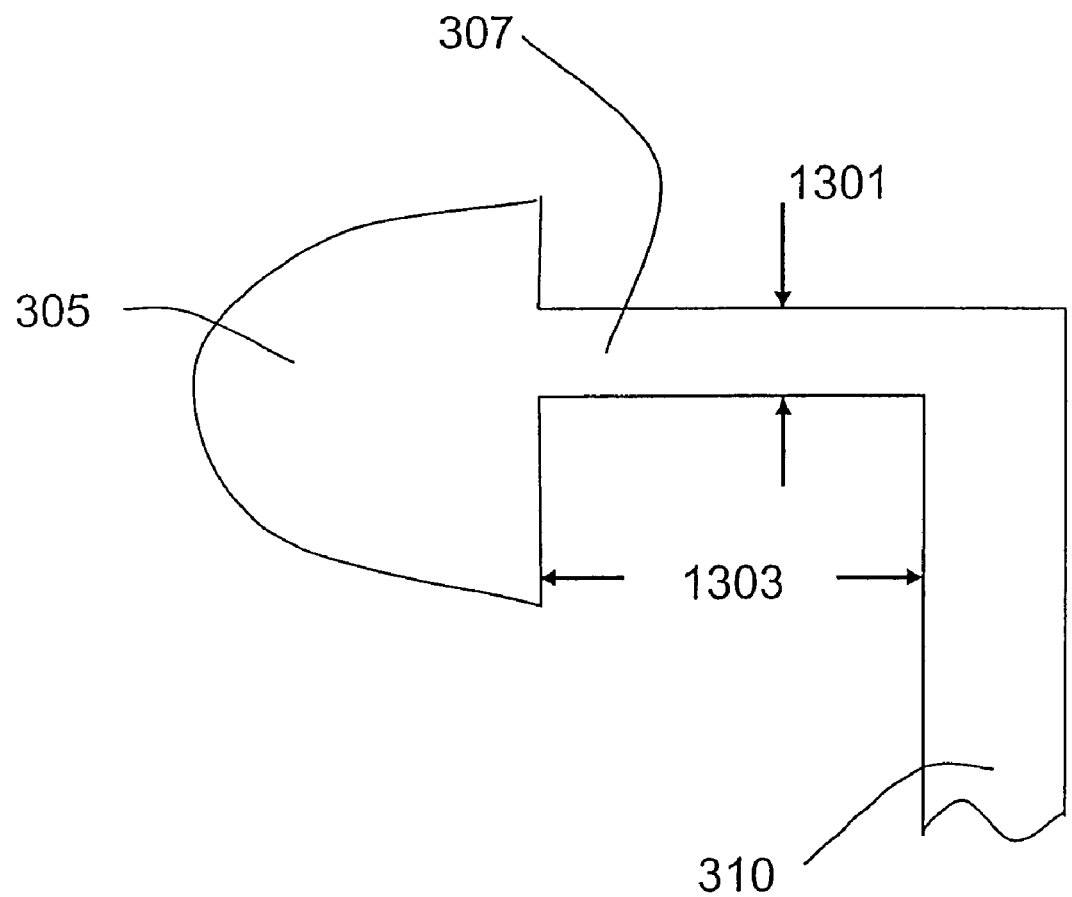
FIGURE: 13b

METHOD AND APPARATUS FOR AN ACTUATOR SYSTEM HAVING BURIED INTERCONNECT LINES

CROSS-REFERENCE TO RELATED APPLICATIONS

This patent application claims benefit to and is a continuation of the United States Patent Application entitled "Actuator Apparatus and Method for Improved Deflection Characteristics," having Ser. No. 10/705,213 filed on Nov. 7, 2003 now abandoned. This application claims the benefit of U.S. Provisional Patent Application No. 60/425,049 entitled Reduced Rotation MEMS Deformable Mirror Apparatus and Method, and U.S. Provisional Patent Application No. 60/425,051 entitled Deformable Mirror Method and Apparatus Including Bimorph Flexures and Integrated Drive, both filed Nov. 8, 2002.

BACKGROUND OF THE INVENTION

1. Field of the Invention

This invention relates to micro-fabricated actuators, and more particularly relates to improving long-stroke deflection characteristics.

2. Description of the Related Art

The advent of micromachining has enabled the economic fabrication of tiny precision micro-actuators and micromachines using techniques first pioneered in the semiconductor industry. Micro-fabricated actuators with long stroke are used in a diverse range of applications including adaptive optics, disk drives, fluidic valves, video displays, and micro-positioning.

Microfabricated actuators are often comprised of an actuation means acting on a body or platform mounted to a substrate via a flexible suspension. The suspension allows the actuator to move while providing a restoring force that is a function of deflection. The restoring force allows precise actuator positioning at equilibrium points where the restoring force counter balances the applied actuation force. The design requirements to ensure good deflection characteristics for the actuator are manifold. The suspension must be rigid enough so actuator natural frequency is above the minimum needed for fast dynamic response. In addition, the suspension must have enough rigidity to ensure robust mechanical shock and vibration survival. On the other hand, the suspension must be flexible to allow full scale deflection below the maximum actuation force. As the actuator is deflected, the suspension should not warp the body nor cause any excessive extraneous motion that is not in the desired direction of actuation. Finally, the suspension must be as compact as possible to fit within a small footprint to reduce device area and hence cost. A compact suspension is even more critical for tightly packed arrays of actuators such as optical cross connects or deformable mirror arrays.

Some devices require that a micromachined actuator move substantially perpendicularly to the substrate in a piston motion or move in a piston motion as well as rotating about the axes substantially parallel to the substrate in a tip/tilt fashion. Several designs have been invented in an attempt to provide acceptable deflection characteristics for such devices, however all previous solutions have serious drawbacks.

One field where micro-actuators are prevalent is adaptive optics. Adaptive optics ("AO") refers to optical systems that adapt to compensate for disadvantageous optical effects introduced by a medium between an object and an image formed of that object. Horace W. Babcock proposed the concept of adaptive optics in 1953, in the context of mirrors capable of being selectively deformed to correct an aberrated wavefront. As shown in the prior art FIG. 1, a typical application adjusts the wavefront of incoming light 105 using a deformable mirror 100 formed by an array of actuators so that the outgoing light wavefront 110 has reduced aberrations. Numerous actuators in the form of mirrors are tightly packed to form a deformable mirror surface that locally alters light path length. The full system to correct light wavefront aberration is shown in FIG. 2. The light to be corrected 200 enters the device 205, reflects off the deformable mirror 210 and is divided using a beam splitter 220. One portion of the split light enters a wavefront sensor 230 that detects aberrations. A wavefront reconstructor 235 and mirror controller are used to shape the deformable mirror to remove light wavefront aberrations. The second portion of light from the beam splitter 220 enters the science camera 225. The correction performed using the deformable mirror improves the image resolution of the science camera. See John W. Hardy, Adaptive optics for astronomical telescopes, Oxford series in optical and imaging sciences 16, Oxford University Press, New York, 1998. Adaptive optics has a wide range of uses including correcting telescopes for atmosphere turbulence, correcting ophthalmic images for eye cornea distortions, and focusing laser.

Helmbrecht, in Micromirror Arrays for Adaptive Optics, PhD. Thesis, University of California, Berkeley (2002), discloses a segmented deformable mirror for use in AO applications that exhibits high fill-factor and offers the potential for high mirror stroke.

Early MEMS resonators and actuators, for example those pictured in U.S. Pat. No. 5,025,346 Tang (1991), attempted to achieve good deflection characteristics over large motions by using folded beam structures exhibiting strain relief. In U.S. Pat. No. 6,091,050, Carr disclosed a similar folded beam technique using two long bimorph flexures connected at one end forming a U-shaped suspension. The first bimorph is anchored to the substrate with the other end attached to the second bimorph. The second bimorph folds back parallel to the first bimorph and attaches to an actuator body. However, the folded suspension as documented has considerable limitations that make it impractical in practice.

In summary, the prior art does not provide good deflection characteristics for actuators moving substantially perpendicular to a substrate.

SUMMARY OF THE INVENTION

It is therefore an object of the present invention to provide an actuator that can be operated over large deflections with minimal actuation force.

A further object of the invention is to provide an actuator that requires lower actuation voltage to achieve deflection.

Another object of the invention is to provide an actuator that that does not exhibit undesirable rotations or displacements during actuated deflection.

A further object of the invention is to provide an actuator that does not impact adjacent actuators in a tightly packed array.

Yet another object of the invention is to provide an actuator that does not significantly warp or misshape the actuator body during large deflections.

Another object of the invention is to provide an actuator that is space efficient to assure a small device area and the ability to tightly pack large arrays of actuators.

A further object of the invention is to provide an actuator that maximizes electrode area beneath the actuator body in the case of electrostatic actuation.

Another object of the invention is to provide an actuator that minimizes actuator body exposed to the actuation force of adjacent actuators in the case of tightly packed actuator arrays.

A further object of the invention is to provide an actuator that does not have exposed high voltage interconnect to reduce to reduce the potential for shorting due to particles or process coatings.

Another object of the invention is to provide an actuator suspension that exhibits less spring softening during electrostatic actuation to reduce the problem of snap-in.

Still further objects and advantages will become apparent from a consideration of the ensuing description and drawings.

The present invention, roughly described, pertains to a micromachined actuator on a substrate. The actuator comprises a suspension system anchored to the substrate and a body mounted to the suspension system. In one aspect, the suspension system comprises a set of one or more spring flexures connecting the actuator body to the substrate with strain relief provided via connecting torsional elements.

In one embodiment of the present invention, the suspension system is comprised of at least one spring flexure connecting the actuator body to the substrate and having strain relief provided via torsionally weak attachments or torsional springs.

In the second embodiment of the present invention, the suspension system includes a first set of one or more spring flexures each with one end anchored to a largely rigid intermediate frame and the other end attached to the actuator body. A second set of one or more of flexures is attached between to the intermediate frame and the substrate.

In the third embodiment of the invention the electrostatic forcing electrodes are shaped to reduce drive voltage.

In a fourth embodiment of the invention is a buried interconnect comprised of polysilicon conductive lines isolated with silicon nitride to provide voltage to the force electrodes and mirror suspensions.

In another embodiment, all four of the above embodiments above may be combined such that all flexure connections to the frame and body of the second embodiment are joined using the torsional springs used in the first embodiment. Furthermore, electrode area is maximized and polysilicon/nitride interconnect are used.

In still another embodiment, the first, second and third embodiments are combined and prior art polysilicon/oxide interconnect or integrated circuitry is used to control actuation electrode voltages.

Numerous other embodiments are possible by combining any three or two of the embodiments to form new embodiments.

These and other objects and advantages of the present invention will appear more clearly from the following description in which the preferred embodiment of the invention has been set forth in conjunction with the drawings.

BRIEF DESCRIPTION OF THE DRAWINGS

FIG. 4 illustrates a single flexure joined to an actuator body using a simple torsional spring according to the present invention.

FIG. 5 illustrates a serpentine flexure joined to an actuator body using a serpentine torsional spring according to the present invention.

FIG. 6 shows a top plan view of the second embodiment of the present invention having an intermediate frame.

FIG. 7 shows a side view of the second embodiment of the present invention having an intermediate frame.

FIG. 8 illustrates electrode shaping to reduce electrostatic drive voltage.

FIG. 9 illustrates the fabrication layers used to fabricate the invention with multiple polysilicon layers and nitride or oxide isolation for interconnect, beams, and electrodes.

FIG. 10 illustrates the fabrication layers used to fabricate the invention with a simple polysilicon layer for interconnect and electrodes.

FIG. 12 shows a simple bimorph cantilever to highlight changes in angle and location of the free end.

FIG. 13a shows a table of torsional spring rigidity based on beam dimensions and material properties of silicon.

FIG. 13b illustrates dimensions of a single flexure joined to an actuator body using a simple torsional spring according to the present invention.

DETAILED DESCRIPTION

The disclosure of the United States Patent Application entitled "Actuator Apparatus and Method for Improved Deflection Characteristics," having Ser. No. 10/705,213 filed on Nov. 7, 2003, is expressly incorporated herein by reference.

A new micromachined actuator has been developed to provide improved deflection characteristics for piston motion largely perpendicular to a substrate and piston plus rotation about axes substantially parallel to said substrate. The actuator body or platform is mounted to a suspension system anchored to said substrate. An actuation force acting largely on the body will cause it to move. During actuation, the body will move to an equilibrium displacement dictated by the flexibility of the suspension system.

Figure 1:
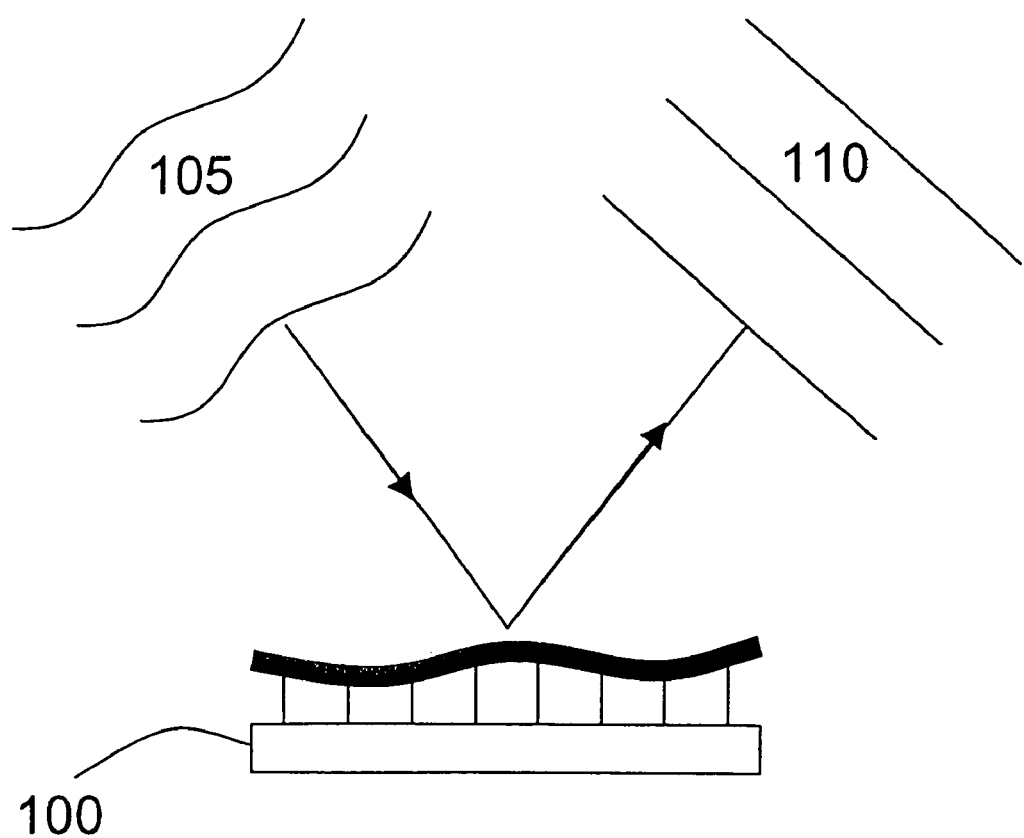
FIG. 1 shows a prior art example of how an array of actuators forming a deformable mirror may adjust light.
Figure 2:
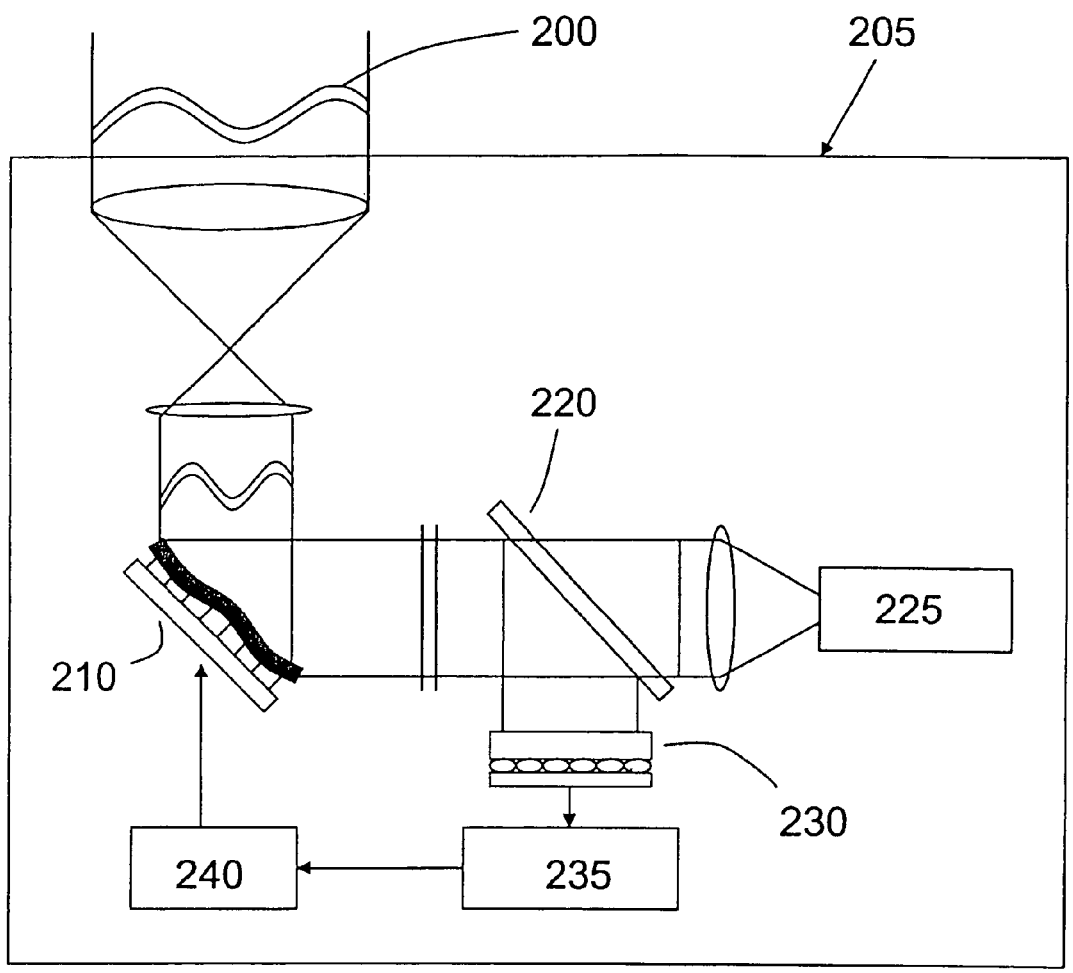
FIG. 2 shows a prior art example of how an array of actuators forming a deformable mirror may be used in an optical system.
Figure 3:
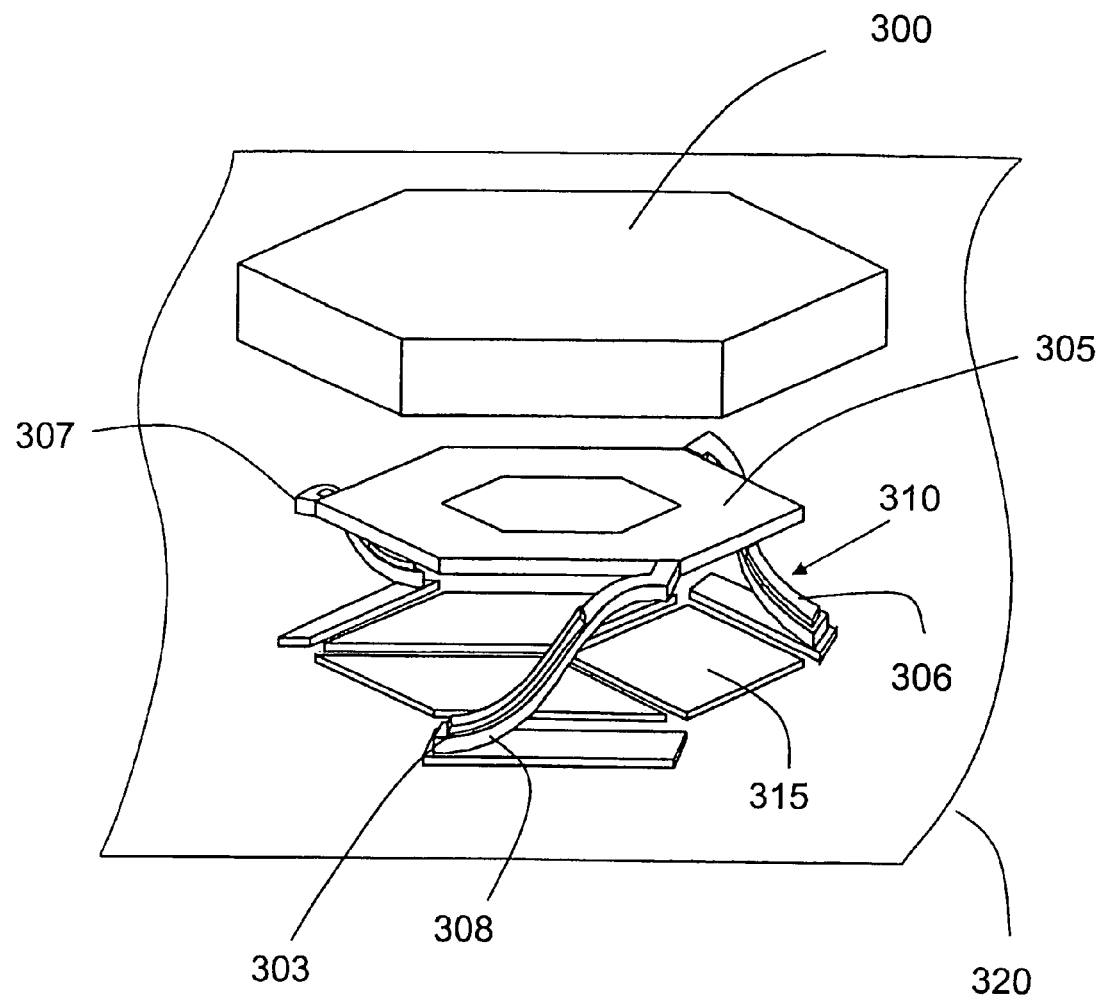
FIG. 3 shows a partially explored perspective view of an actuator in accordance with the first embodiment.

One embodiment of the present invention includes an actuator having bimorph flexures that connect (electrically and mechanically) to the actuator and elevate it above the substrate. Although this actuator could be used for many applications, the invention will be described with respect to its application in a deformable mirror. A partially exploded perspective drawing of a single actuator is shown in FIG. 3 in accordance with the present invention. In the exemplary arrangement of FIG. 3, an actuator segment 300, which is shown as a hexagon but could also be an equilateral triangle, square, or any other shape, is disposed over a platform 305 to which the actuator segment 300 is bonded. The platform 305 may be mechanically and electrically attached to one or more elevating bimorph flexures 310. In the exemplary arrangement of FIG. 3 there are three such flexures 310 per hexagonal actuator segment. In an alternative embodiment, the platform 305 is not required and the actuator segment 300 is attached directly to the flexures 310. In an exemplary arrangement for the implementation shown in FIG. 3, the flexure is on the order of two hundred microns in length and the actuator segment is on the order of 210 microns on a side. Residual stress differences or differences in the coefficient of expansion between the polysilicon layer 306 and the silicon nitride layer 308 forming the bimorph flexures will cause curvature of the flexures thereby lifting the actuator segment to achieve an elevation on the order of twenty microns above the substrate.

In an exemplary arrangement, the anchor points 303 are torsionally strong to adhere the entire structure to the underlying substrate 320. The set of attachments 307 to the actuator platform are torsionally weak, so as to relieve angular strain caused by the difference between the flexure 310 angle and the angle of the platform 305. While other structures and arrangements of torsionally strong and torsionally weak attachments are possible to achieve the same or a similar effect, the above described exemplary arrangement is simple, robust and effective. Other possibilities include reversing the ends of the flexure to which the torsionally weak and strong attachments are made or even placing a torsionally weak element in the center of the flexure with both ends strongly attached. For purposes of the present invention, in one aspect, torsionally weak attachments have average angles of twist per unit moment ($\theta$/Nm) of greater than about 7.00E+06, and torsionally strong attachment have angles of twist per unit moment ($\theta$/Nm) of less than about 2.5E+06. Other angles of twist and ranges thereof are within the scope of the present invention.

FIG. 4 shows a simple torsional bar as the weak torsion element. The strength can be adjusted by increasing length, decreasing thickness normal to the page, or decreasing width vertical to the page. Generally the thickness is set by process and flexure design constrains, so length and width are the key variables. A more area efficient design for the torsional attachment is shown in FIG. 5 where the beam is folded to form a serpentine. Indeed, a wide range of torsionally weak attachments may be used, and the examples described herein should not be considered limiting.

Referring again to FIG. 3, the actuator platform 305 can be actuated in a piston motion largely perpendicular to the substrate as well as a tilting rotation about the axes largely parallel to the substrate. To achieve actuation, parallel plate drive electrodes 315, one for each flexure in the arrangement of FIG. 3, actuate the hexagonal actuator segment by means of electrostatic actuation. Typically the actuator platform and mirror segment are held at a constant voltage potential by electrical connect through the conductive flexures. Placing an equal voltage on all three electrodes will provide purely piston translation, while applying different voltages on each electrode will provide both piston translation and rotation. The present invention provides an actuator that operates with less than 100V, while maintaining large stroke (displacement). Three actuators provide the ability to control the three displacement variables; however, obviously fewer or more electrodes could be used depending on the applications. Furthermore, the use of electrostatic actuator is used as a an example, but other actuation means including thermal, magnetic, piezoelectric, pressure, mechanical, or any combination could be utilized.

Turning next to FIG. 6, a second embodiment of the current invention is presented for reduction of rotation due to both elevation during manufacture and actuation is illustrated schematically. A first set of bimorph flexures 601 is affixed to the substrate 600 by anchor points 603. Next, the bimorph flexures 601 are connected to an intermediate frame 605 via an attachment portion 607. Third, a second set of bimorph flexures 609 is connected to the intermediate frame 605 via attachment portions 610. Fourth, the second set of flexures 609 is connected to the actuator platform 612 or directly to the actuator segment itself (not shown) via attachment portions 611.

The elevation/deflection of the bimorph flexures causes their length projected on to the plane of the substrate to contract. Deflection of the first set of bimorph flexures 601 induces the intermediate frame 605 to rotate clockwise. Likewise, the deflection of the second set of bimorph flexures 609 induces a counterclockwise rotation between the intermediate frame and the actuator platform. This rotation is counter to the rotation of the first set of bimorphs flexures 601. If the contractions are designed to be equivalent, the actuator segment 612 does not rotate during elevation or actuation. FIG. 7 shows a side view of the second embodiment to detail the elevation of the intermediate frame and the actuator platform.

As with the first embodiment, actuation is achieved using three electrodes 615 beneath the platform 611 to impart piston as well as tilting rotation to the actuator. One of the three electrodes can be seen in the side view of FIG. 7. A silicon mirror segment 613 is attached to the top of the actuator to provide a flat, reflective surface.

Another embodiment of the present invention minimizes the voltage necessary for actuation through the shaping of the actuation electrodes. For any actuator using electrostatic forcing, minimizing the voltage required for actuation is desirable as high voltage circuits are both expensive and complicated. From the equation governing electrostatic attraction between two parallel plate capacitors, those skilled in the art will recognize that for a fixed actuation force (Fe), decreasing the applied voltage (V) requires a decrease in the electrode gap (g), or an increase in the electrode area (A). Since the gap (g) is fixed by the stroke required of the actuator, the electrode area (A) must be maximized to overcome the voltage decrease.

However, prior art actuator electrodes have been made to be symmetric at the expense of total electrode area. Specifically, the electrodes have been symmetric with respect to the line between the electrode center of force and the center of the actuator device. The symmetry produces tip and tilt motions that are likewise symmetric and presumably easier to calibrate and control. On the other hand, this has increased the voltage requirements for actuation.

In a feature of the present invention, an asymmetric electrode is contemplated which reduces the voltage necessary to deflect the actuator. For the drive electrodes, increasing the area is trivial as they can simply be made larger until they encroach on the electrodes of the neighboring actuator or lie beneath regions of the flexure that do not have enough clearance to protect against snap-in. An adequate gap (>0.2 microns) must generally be left between electrodes to prevent shorting. As an example, the electrodes of first and second embodiment may be diamond shaped using prior art, but will have a skewed non-diamond shape if maximized using this feature of the invention. FIG. 8 illustrates an asymmetric shaped electrode 315 that minimizes voltage without encroaching on adjacent actuator electrodes or endangering flexure snap-in for the first embodiment.

A fourth embodiment, shown in FIG. 9 of the present invention provides interconnect to the forcing electrodes of an actuator or an array of actuators. The invention allows interconnect lines to be routed beneath exposed forcing electrodes 315 while providing compatibility with the processing required for actuators. One or more interconnect lines made of polysilicon 905 are isolated from the substrate 320, other interconnect lines, and the actuator structure by silicon nitride layers 903 and 907. Each polysilicon electrical interconnect is encased in silicon nitride except at via locations 919 that allow electrical connection to polysilicon and actuator structural layers above.

In another embodiment, all four of the above embodiments above are combined to maximum benefit. Referring to FIG. 6, the anchoring to the substrate of the first set of flexures 601 and the attachment points 610 of the second set of flexures 609 attached to the intermediate frame 605 are rigid. Conversely, the attachment points 607 of the first set of flexures 601 to the intermediate frame 605 and the attachment points 611 of the second set of flexures attached to the actuator platform 612 are both relatively weak in torsion. This provides strain relief between the bimorph flexures and both the intermediate frame and actuator platform. While other structures and arrangements of torsionally strong and torsionally weak attachments are possible to achieve the same or a similar effect, the above described exemplary arrangement is used. In addition, the electrode area is maximized as in embodiment three and polysilicon/nitride interconnect are used as in the embodiment of FIG. 9.

In still another embodiment, the first, second, and third embodiments are combined. Numerous other embodiments are possible by combining any three or two of the embodiments contained herein.

The actuator embodiments described above can be fabricated using many micromachining means. The structures may be fashioned from polysilicon, single crystal silicon, germanium, metals, conductive polymers, and many other options. In addition, the actuator may be coupled to various electrical interconnection layers or electrical circuitry to provide drive voltages. The actuators may be fabricated directly atop interconnect and circuitry, or may be fabricated separately and then assembled. An exemplary fabrication method described herein builds a polysilicon actuator on top of a polysilicon interconnect isolated with nitride. Then a single crystal silicon hexagon mirror surface is attached to the actuator using an assembly process.

The fabrication process proceeds by first forming the electrical interconnection on a silicon wafer. The present invention offers an improved design for connecting the drive circuitry to the actuator forcing electrodes. In the present invention, as shown in FIG. 9, the electrical connections to the actuator segment electrodes are covered with an isolation layer that is compatible with the subsequent actuator segment fabrication. This is achieved by first depositing over a substrate 320 a silicon nitride ($Si_xN_y$) passivation/isolation layer 903, followed by an in-situ doped polysilicon layer 905 on top of the silicon wafer (using low pressure chemical vapor deposition). The polysilicon is then photolithographically patterned using a plasma etch to define the electrical connection lines. Thus the polysilicon may be thought of as a wiring layer. A second SiN passivation layer 907 is then deposited by LPCVD to encase the conductive polysilicon lines in an electrically isolating medium. In one embodiment, a low-stress, non-stoichiometric silicon nitride layer is used, however in theory, any isolating, HF resistant thin film would work. The SiN layer 907 is then photolithographically patterned and etched to form vias 919 to the electrically conductive polysilicon lines 905. A second polysilicon layer is then deposited and patterned to form the actuation electrodes 315 and provide an electrical connection between the bimorph flexures and the wiring layer 905. Next, a sacrificial silicon oxide is uniformly deposited over the entire wafer (not shown). Photolithography and subsequent etching form holes through the sacrificial oxide that allow electrical connection to the flexures described next. The interconnection polysilicon layer are typically 0.25 to 4 micrometers in thickness.

The mechanical actuator fabrication can now continue with polysilicon deposition and photolithographic patterning of the first bimorph flexure layer 911 and actuator platform 305 (both typically formed from the same polysilicon layer). The vias 919 in the SiN layer together with the polysilicon connections 905 provide the electrical connection between the drive electronics and actuation electrodes. At this point, the second layer 913 of the bimorph flexures is deposited and patterned such that it covers only the portions of the flexures that are to exhibit curvature to elevate the platform. The second bimorph material may be metal or other materials but in one embodiment is silicon nitride. The deposition of both layers of the bimorph is engineered to ensure the differences in residual stress or differences in thermal expansion create the desired curvature in the finished device. Structural polysilicon and silicon nitride layers are typically 0.25 to 4 micrometers in thickness.

Next, a single crystal silicon mirror segment 300 is attached to the underlying polysilicon actuator platform. This segment is fabricated by deep reactive ion etching (DRIE) the top layer of a silicon-on-insulator (SOI) wafer. The segment may be on the order of 5-30 micrometers in thickness. The single crystal segment is attached using solder bump formation and flip-chip bonding well known in the art. After bonding, the SOI handle wafer is removed and HF release removes all exposed silicon oxide thereby allowing the segment to be elevated by the bimorph flexures. At this point, optional optical coatings such as aluminum, gold, or dielectrics may be applied to the mirror top surface.

Figure 11:
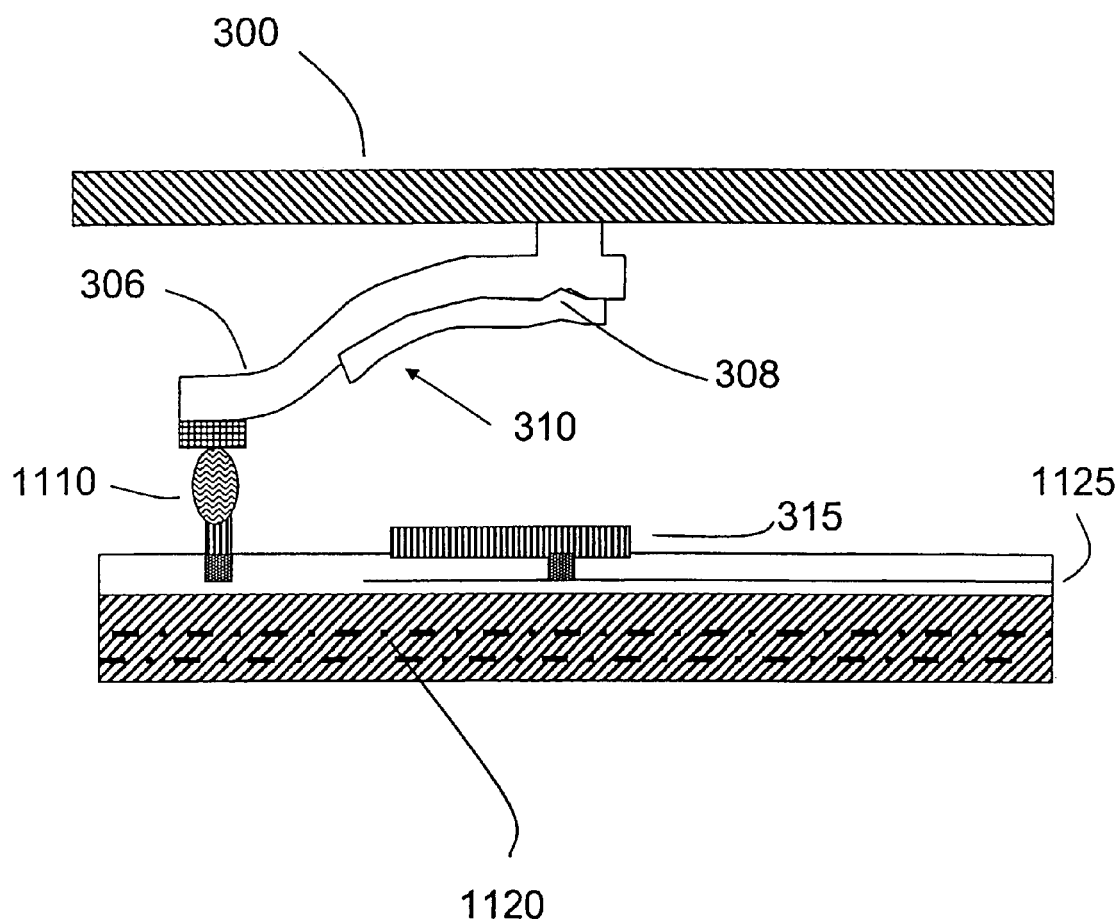
FIG. 11 illustrates the fabrication of actuators by assembling micromachined components with integrated circuits.

Many other fabrication methods are available for building the present invention. Two examples are a process that does not have buried interconnect as shown in FIG. 10 and a fully integrated process shown in FIG. 11. In the first case, the polysilicon interconnect with silicon nitride isolation is not undertaken. Instead the process begins with a silicon nitride layer on a silicon wafer and continues with the electrode 315 polysilicon layer. The process of FIG. 11 assembles mechanical element onto a circuit substrate 1120 to form the actuator and drive electronics. The mechanical element is fastened to the circuit element by a bonding layer 1110. A barrier layer 1125 protects the circuits from the etching process used to release the actuator from a handle wafer as commonly used in the art.

Alternative embodiments may be created by forming a large cavity beneath the actuator rather then elevating the actuator using bimorph flexures. In this case, the actuation electrodes would be positioned at the bottom of a cavity, perhaps 20 micrometers deep. The actuator would be mounted to the top rim of the cavity by the flexures without the second bimorph layer being applied. In the absence of actuation voltage, the actuator would remain largely level with the rim of the cavity. When voltage is applied to the actuation electrodes, the actuator platform would deflect down into the cavity. This method would require a very thick, perhaps more than 20 micrometer, sacrificial layer or could be fabricated by assembly. Most of the advantages described for the bimorph embodiment would also apply to this cavity embodiment.

The operation of each of the embodiments is similar. In each case, bimorph flexures curve upward away from the substrate thereby elevating the actuator platform and mirror segment. The flexures provide a flexible suspension upon which the actuator platform can be moved in translation substantially perpendicular to the substrate or tilted in rotation about the two axes substantially parallel to the substrate. The actuation is accomplished using three high voltage electrodes placed beneath the actuator platform.

FIG. 12 illustrates key features of the bimorph flexures that will aid in understanding the advantages of this invention. An isolated bimorph with one end anchored and the other end free is depicted. Note that the free end is not parallel to the substrate but rather at an angle. In contrast, FIG. 3 shows that both ends of the bimorph flexures 310 to be parallel to the substrate 320 in the complete actuator. Hence, there must be a moment on the end of the beam to force the angle from the free position. This moment can warp the platform and the mirror segment if the strain is not relieved. Furthermore, the moment acts against the elevation force of the flexures thereby reducing achievable height from the substrate. Finally, this is a spring hardening geometry, so the suspension is nonlinear and softens with higher actuation voltage thus invoking earlier snap-in during electrostatic actuation. All of these drawbacks may be circumvented by the present invention in the first embodiment. Namely, the torsionally weak attachment points or torsional springs 307 on the flexures allow the flexure ends to have an angle not parallel to the substrate. This strain relief reduced platform warpage, increases stroke height, and reduces spring softening during actuation.

The stiffness of the attachment portion is a function of the material and beam dimensions including height 1301 ($h$), length 1303 ($i$), and film thickness (t) as defined in FIG. 13a and as illustrated in FIG. 13b. In an exemplary arrangement, the attachment portions are made of polysilicon. As discussed above, if the stiffness of the attachment portion is too great, it will decrease the overall deflection/elevation of the bimorph flexures and cause unwanted bowing of the actuator segment electrode. Therefore, the present invention provides attachment portion designs with lower stiffness. For purposes of the following discussion, the properties of the attachment are characterized in terms of the angle of twist per unit moment ($\theta$/Nm), which is the inverse of the torsional rigidity (Nm2/$\theta$) over the attachment height (h). These characteristics may be better appreciated from the table of FIG. 13a, which provides examples of selected values.

In one arrangement, it is desirable for the angle of twist per unit moment for the attachment to be greater than about $7.0 \times 10^6$ $\theta$/Nm.

The thickness (t) of the attachment is the most physically constrained, and it is difficult to make a polysilicon attachment less than about 0.25 µm and greater than about 4 µm. Below 0.15 µm, polysilicon attachments simply are not strong enough to support the actuator segment during actuation. Above 4 µm, the fabrication process is rendered too complex, time-consuming and expensive. The table of FIG. 13 shows some acceptable values for i and h, given at value of 1.10 microns, and the corresponding acceptable angle of twist per unit moment. Within the range of 0.25 µm to 4 µm for t, embodiments of the present invention for i have to be at least 2 µm but not greater than 20 µm, and h have to be at least 2 µm but not greater than 40 µm.

Another important point notable in FIG. 12 is that the horizontal distance from the anchor point to the free end shrinks during elevation. When this happens with the first embodiment of the invention of FIG. 3, the platform will rotate clockwise (as viewed when looking down at the substrate) due to the change in projected horizontal distance of the flexures 310. In many applications with tight spacing requirements such as deformable mirror arrays or optical crossconnect switches, this rotation can be detrimental as adjacent actuators could touch. Note that flipping some flexures to extend clockwise and others counterclockwise causes spring hardening and does not remove the rotation for odd numbers of flexures. The second embodiment negates this draw back by using two sets of flexures and an intermediate frame. The example in FIG. 6 shows the flexures are designed so the intermediate frame 605 rotates clockwise while the actuator platform 612 rotates counterclockwise. If designed properly, these rotations cancel out leaving the mirror without rotation. Combining the advantages of the first and second embodiment provides the maximum benefit. In all cases, the suspension are compact to reduce device area and maximize electrostatic actuation electrode area.

The present invention has several features to reduce actuation voltage requirements. In the first and second embodiments, because the attachment points are weak, less bimorph force is needed to elevate the actuator platform to the required stroke height. This reduces the level of electrostatic force needed to deflect the bimorph springs downward. The rather compact flexure suspension designs allow greater area beneath the platform to be used for actuation electrodes. Electrostatic force increases with increased area, so the voltage required decreases. This is taken fully advantage of in the third embodiment by using electrodes that maximize area regardless of asymmetry. Another advantage is the novel interconnect of embodiment four that uses polysilicon signal lines and silicon nitride isolation to allow routing of drive lines in a layer beneath the forcing electrodes. Hence, electrode area is not compromised by interconnect and actuators are not exposed to the control voltages of adjacent mirrors. Finally, the buried interconnect reduces the chance that particles and fabrications coatings may cause shorts in the electrical lines.

The present invention overcomes many of the drawback plaguing prior art. The design provides a simple, manufacturable, and economical method for fabricating micromachined actuators with large stroke and solid robustness. New suspension designs increase the stroke height of a bimorph suspension and reduce the actuation voltage required to achieve the full stroke. The effects of spring softening are also reduced for more stable electrostatic actuation. The novel suspensions reduce actuator platform deformation and alleviate unwanted rotation of the actuator about the axis substantially perpendicular to the substrate. Negating the rotation is particularly important for applications with tightly packed actuators. The need for compactness to reduce device area and allow tight packing is also fulfilled. The compact suspensions and new silicon/silicon nitride interconnect allow more area for electrostatic force electrodes thereby reducing actuation voltage. This is further improved by using non-symmetrical forcing electrodes that maximize electrode area. The buried interconnect ensures reduced cross coupling between mirrors because drive lines are not expose to adjacent mirrors. Finally, the possibility of shorting due to particles and process coating is reduced by the use of buried interconnect.

It will be appreciated by those skilled in the art that exemplary embodiments of the invention have been described and are illustrated in the accompanying drawings. While the invention has been described in conjunction with these specific embodiments, it will be understood that the invention is not be limited to these embodiments but instead covers alternatives, modifications, and equivalents as are within the spirit and scope of the invention. For example the actuator body may be square, triangular, rhombic, or any other shape; more or fewer than three flexures may be used; various fabrication materials may be used; various fabrication process sets may be used; the weak and strong torsional elements may be in different locations along or at the ends of the flexures; torsionally weak elements my be straight, serpentine, or other forms; actuation may be electrostatic, magnetic, piezoelectric, thermal, via pressure, and mechanical means.

While numerous specific details have been set forth in order to provide a thorough understanding of the present invention, numerous aspects of the present invention may be practiced with only some of these details. In addition, certain process operations and related details which are known in the art have not been described in detail in order not to unnecessarily obscure the present invention.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An actuator system, comprising:
a microelectromechanical (MEMS) structure comprising;
an actuator body connected with a suspension system; and
the suspension system connected with a set of layers, the suspension system being configured to elevate the actuator body above the set of layers upon actuation in a motion substantially perpendicular to the set of layers, the suspension system comprising a set of one or more flexures and a set of one or more torsional elements, wherein each flexure connects the actuator body with the set of layers and each torsional element connects a corresponding flexure with the actuator body and provides strain relief between the corresponding flexure and the actuator body, wherein each torsional element has a length comprising the distance from the corresponding flexure to the actuator body, the length being greater than the width of the torsional element; and
the set of layers comprising:
an electrode layer comprising a set of one or more electrodes for actuating the MEMS structure when a voltage is applied to the set of electrodes, each electrode having a skewed asymmetrical non-diamond shape and being located underneath the center of the actuator body and extending to a location underneath the edge of the actuator body; and
an interconnect layer comprising a set of one or more interconnects coupled to the set of electrodes, the set of interconnects being coupled to a control circuit for controlling voltages applied to the set of electrodes via the set of interconnects, the interconnect layer being beneath the electrode layer.

2. The actuator system of claim 1, wherein each torsional element relieves angular strain caused by a difference between the angle of the corresponding flexure and the angle of the actuator body.

3. The actuator system of claim 1, wherein the set of layers further comprises:
a first isolation layer comprising an electrically isolating film, the first isolation layer being between the electrode layer and the interconnect layer; and
a second isolation layer comprising an electrically isolating film for electrically isolating the set of interconnects, the second isolation layer being beneath the interconnect layer.

4. The actuator system of claim 1, wherein the actuator body is a platform, actuator segment, or mirror segment.

* * * * *